United States Patent
Irie et al.

(10) Patent No.: US 10,585,345 B2
(45) Date of Patent: Mar. 10, 2020

(54) PHOTOMASK BLANK, METHOD FOR MANUFACTURING PHOTOMASK, AND MASK PATTERN FORMATION METHOD

(71) Applicant: SHIN-ETSU CHEMICAL CO., LTD., Tokyo (JP)

(72) Inventors: Shigeo Irie, Joetsu (JP); Takashi Yoshii, Joetsu (JP); Keiichi Masunaga, Joetsu (JP); Yukio Inazuki, Joetsu (JP); Hideo Kaneko, Joetsu (JP); Toyohisa Sakurada, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 29 days.

(21) Appl. No.: 15/542,296

(22) PCT Filed: Feb. 15, 2016

(86) PCT No.: PCT/JP2016/054225
§ 371 (c)(1),
(2) Date: Jul. 7, 2017

(87) PCT Pub. No.: WO2016/140044
PCT Pub. Date: Sep. 9, 2016

(65) Prior Publication Data
US 2018/0267398 A1    Sep. 20, 2018

(30) Foreign Application Priority Data

Mar. 4, 2015 (JP) .................................. 2015-042216
Feb. 8, 2016 (JP) .................................. 2016-021469

(51) Int. Cl.
| G06F 1/00 | (2006.01) |
| G03F 1/32 | (2012.01) |
| G03F 1/46 | (2012.01) |
| G03F 1/38 | (2012.01) |
| G03F 1/58 | (2012.01) |
| G03F 1/80 | (2012.01) |
| H01L 21/033 | (2006.01) |

(52) U.S. Cl.
CPC .................. *G03F 1/32* (2013.01); *G03F 1/38* (2013.01); *G03F 1/46* (2013.01); *G03F 1/58* (2013.01); *G03F 1/80* (2013.01); *H01L 21/0337* (2013.01)

(58) Field of Classification Search
CPC ..... G03F 1/32; G03F 1/38; G03F 1/50; G03F 1/54; G03F 1/80
USPC .......................................................... 430/5
See application file for complete search history.

(56) References Cited

U.S. PATENT DOCUMENTS

| 2006/0088774 A1* | 4/2006 | Yoshikawa ............... G03F 1/32 430/5 |
| 2013/0177841 A1 | 7/2013 | Sakai et al. |
| 2013/0309598 A1 | 11/2013 | Fukaya et al. |
| 2015/0086908 A1 | 3/2015 | Inazuki et al. |
| 2015/0086909 A1* | 3/2015 | Yoshii ....................... G03F 1/26 430/5 |
| 2015/0338731 A1 | 11/2015 | Nozawa et al. |

FOREIGN PATENT DOCUMENTS

| EP | 1650600 A2 | 4/2006 |
| EP | 1832925 A2 | 9/2007 |
| EP | 1847874 A2 | 10/2007 |
| JP | 63-85553 A | 4/1988 |
| JP | 7-49558 A | 2/1995 |
| JP | 2008-26500 A | 2/2008 |
| JP | 2012-68314 A | 4/2012 |
| JP | 2013-238691 A | 11/2013 |
| JP | 2013-238776 A | 11/2013 |
| JP | 2014-137388 A | 7/2014 |
| JP | 2016-35546 A | 3/2016 |
| TW | 201327025 A1 | 7/2013 |
| WO | WO 2012/043695 A1 | 4/2012 |
| WO | WO 2013/062104 A1 | 5/2013 |

OTHER PUBLICATIONS

Extended European Search Report for European Application No. 16758738.5, dated Jul. 24, 2018.
International Search Report, issued in PCT/JP2016/054225, PCT/ISA/210, dated May 10, 2016.
Written Opinion of the International Searching Authority, issued in PCT/JP2016/054225, PCT/ISA/237, dated May 10, 2016.
Taiwanese Office Action and Search Report for Taiwanese Application No. 105105138, dated Jun. 12, 2019.

* cited by examiner

*Primary Examiner* — John A McPherson
(74) *Attorney, Agent, or Firm* — Birch, Stewart, Kolasch & Birch, LLP

(57) ABSTRACT

A photomask blank (1) having: a transparent substrate (10); a first film (11) etched by chlorine/oxygen-based dry etching and made of a material having resistance against fluorine-based dry etching; and a second film (12) formed adjacent to the first film and made of a material which comprises silicon and oxygen or silicon, oxygen, and nitrogen and has an Si—Si bond and which is substantially not etched by chlorine/oxygen-based dry etching, wherein: the photoresist adhesive performance is improved; the resist pattern is stably maintained without degrading, collapsing, or peeling even when a fine resist pattern is formed from a photoresist film; and an excellent shape and dimensional accuracy is obtained in regard to etching of a lower layer film in which the resist pattern is used.

16 Claims, 8 Drawing Sheets

PHOTOMASK BLANK, METHOD FOR MANUFACTURING PHOTOMASK, AND MASK PATTERN FORMATION METHOD

TECHNICAL FIELD

This invention relates to photomask blanks from which photomasks for use in the microfabrication of semiconductor integrated circuits or the like are produced, a method for preparing a photomask, and a method for forming a mask pattern.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing inter-layer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask is required to have a high accuracy.

Further, in the currently prevailing lithography, a circuit pattern to be written has a size far smaller than the wavelength of light used. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied. Then, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is approximately equal to or greater than the resolution limit necessary for the photolithography used in a semiconductor processing step using a photomask.

PRIOR ART DOCUMENTS

Patent Documents

Patent Document 1: JP-A S63-085553
Patent Document 2: JP-A H07-049558

SUMMARY OF THE INVENTION

Problems to be Solved by the Invention

A photomask pattern is generally formed by forming a photoresist film on a photomask blank having a light-shielding film on a transparent substrate, writing a pattern using electron beam, and developing to form a resist pattern. Using the resulting resist pattern as an etch mask, the light-shielding film is etched into a light-shielding film pattern. In an attempt to miniaturize the light-shielding film pattern, if processing is carried out while maintaining the thickness of the photoresist film at the same level as in the prior art prior to the miniaturization, the ratio of film thickness to pattern, known as aspect ratio, becomes higher. As a result, the resist pattern profile is degraded, preventing effective pattern transfer, and in some cases, there occurs resist pattern collapse or stripping. Therefore, the miniaturization must entail a thickness reduction of resist film.

For reducing the load on resist during dry etching, it is effective to use a hard mask film in the form of an inorganic film as etching mask. For example, JP-A S63-085553 (Patent Document 1) reports that a $MoSi_2$ film is overlaid with a $SiO_2$ film, which is used as an etch mask during dry etching of the $MoSi_2$ film with chlorine-containing gas. It is described that the $SiO_2$ film can also function as an antireflective film. Also, for example, JP-A H07-049558 (Patent Document 2) describes that a phase shift film is overlaid with a chromium film as light-shielding film, which is, in turn, overlaid with a $SiO_2$ film as hard mask.

While silicon dioxide films such as $SiO_2$ film are generally processed by dry etching with a fluorine-based gas, the dry etching of silicon dioxide film with a fluorine-based gas suffers from a slow etching rate. To reduce the thickness of photoresist film to meet the above-discussed demand, it is effective from the standpoint of etching rate as well to reduce the thickness of hard mask film. If the silicon dioxide film is deposited by sputtering, for example, island-like growth occurs at the initial stage of sputter deposition, and so the resulting film has a certain thickness distribution in plane, that is, includes thick regions and thin regions. For this reason, if the thickness of hard mask film is too thin, the film fails to provide an effective thickness to function as a hard mask throughout the overall plane of the hard mask film. Thus the hard mask film must have a thickness above a certain level. As a result, a photoresist film formed on the hard mask film must have a proper thickness relative to the thickness of hard mask film. To form a fine pattern using a photoresist film having such a proper thickness, a method capable of maintaining the resist pattern stable on the hard mask film without suffering degradation, collapse or stripping is necessary.

An object of the invention which has been made to solve the outstanding problems is to provide a photomask blank in which when a photoresist film is formed on a film which consists of silicon and oxygen, or silicon, oxygen and nitrogen and which is used as a hard mask relative to a film which is effective as optical films such as light-shielding film and antireflective film or processing aid films such as etching mask film or hard mask film and etching stop film in photomask blanks and which is used as the hard mask for a film composed of a material which is etchable by chlorine/oxygen-based dry etching with a gas mixture of chlorine and oxygen gases, and resistant to fluorine-based dry etching with a fluorine-containing gas, such as chromium-containing material, the adhesion of photoresist film to the relevant film is improved, and when a fine resist pattern is formed in the photoresist film, the resist pattern is maintained stable without suffering degradation, collapse or stripping; a method for preparing a photomask using an etching mask film having improved adhesion and a photoresist film; and a mask pattern forming method.

Means for Solving the Problems

Making extensive investigations to solve the outstanding problems, the inventors have found that when a film which is used as a hard mask relative to a film which is useful as optical films such as light-shielding film and antireflective film or processing aid films such as etching mask film or hard mask film and etching stop film in photomask blanks and which is used as the hard mask for a film composed of a material which is etchable by chlorine/oxygen-based dry etching with a gas mixture of chlorine and oxygen gases, and resistant to fluorine-based dry etching with a fluorine-containing gas, such as chromium-containing material, is composed of a material consisting of silicon and oxygen, or silicon, oxygen and nitrogen, and having a Si—Si bond, then the adhesion of a chemically amplified photoresist film to the relevant film is improved; that when a fine resist pattern is formed in the photoresist film, the resist pattern is maintained stable without suffering degradation, collapse or stripping; and that when any film underlying the resist pattern is etched, a fine mask pattern of satisfactory shape and dimensional accuracy is formed. The present invention is predicated on these findings.

Accordingly, the invention provides a photomask blank, a method for preparing photomask, and a method for forming mask pattern, as defined below.

[1] A photomask blank which is processed into a transmissive photomask for use in photolithography for forming a pattern on a substance to be transferred using exposure light of wavelength up to 200 nm, the photomask blank comprising
 a transparent substrate,
 a first film disposed on the substrate and composed of a material which is etchable by chlorine/oxygen-based dry etching with a gas mixture of chlorine and oxygen gases and resistant against fluorine-based dry etching with a fluorine-containing gas, and
 a second film disposed contiguous to the first film and composed of a material which consists of silicon and oxygen or silicon, oxygen, and nitrogen, is not substantially etched during the chlorine/oxygen-based dry etching of the first film, and has a Si—Si bond.

[2] The photomask blank of [1], further comprising a photoresist film disposed contiguous to the second film and having a thickness of up to 150 nm, the photoresist film being a chemically amplified resist film.

[3] The photomask blank of [1] or [2] wherein the second film contains oxygen in an amount from 1 at % to 66 at %.

[4] The photomask blank of any one of [1] to [3] wherein the second film has a thickness from 2 nm to 20 nm.

[5] The photomask blank of any one of [1] to [4] wherein the second film has a sheet resistivity of up to $1 \times 10^{11} \Omega/\square$.

[6] The photomask blank of any one of [1] to [5], further comprising a phase shift film between the transparent substrate and the first film.

[7] A method for preparing a photomask comprising the steps of:
 forming a first film on a transparent substrate, the first film being composed of a material which is etchable by chlorine/oxygen-based dry etching with a gas mixture of chlorine and oxygen gases and resistant against fluorine-based dry etching with a fluorine-containing gas,
 forming a second film contiguous to the first film, the second film being composed of a material which consists of silicon and oxygen or silicon, oxygen, and nitrogen, has a Si—Si bond and is not substantially etched during the chlorine/oxygen-based dry etching of the first film,
 forming a chemically amplified resist film contiguous to the second film, the resist film having a thickness of up to 150 nm,
 patterning the chemically amplified resist film to form a resist pattern,
 patterning the second film by the fluorine-based dry etching with the resist pattern made etching mask, for thereby forming a mask pattern of the second film, and
 patterning the first film by the chlorine/oxygen-based dry etching with the mask pattern of the second film made etching mask, for thereby forming a mask pattern of the first film.

[8] The method of [7], further comprising the steps of:
 forming a phase shift film between the transparent substrate and the first film, and
 patterning the phase shift film by fluorine-based dry etching with the mask pattern of the first film made etching mask, for thereby forming a mask pattern of the phase shift film.

[9] The method of [7] or [8] which is intended to prepare a transmissive photomask for use in photolithography for forming a fine pattern with a width of up to 30 nm on a substance to be transferred using exposure light of wavelength up to 200 nm.

[10] A method for forming a mask pattern of a first film, the first film being disposed on a transparent substrate and composed of a material which is etchable by chlorine/oxygen-based dry etching with a gas mixture of chlorine and oxygen gases and resistant against fluorine-based dry etching with a fluorine-containing gas, the method comprising the steps of:
 forming a second film contiguous to the first film, the second film being composed of a material which consists of silicon and oxygen or silicon, oxygen, and nitrogen, has a Si—Si bond and is not substantially etched during the chlorine/oxygen-based dry etching of the first film,
 forming a chemically amplified resist film contiguous to the second film, the resist film having a thickness of up to 150 nm,
 patterning the chemically amplified resist film to form a resist pattern,
 patterning the second film by the fluorine-based dry etching with the resist pattern made etching mask, for thereby forming a mask pattern of the second film, and
 patterning the first film by the chlorine/oxygen-based dry etching with the mask pattern of the second film made etching mask, for thereby forming a mask pattern of the first film.

Advantageous Effects of the Invention

The adhesion of a photoresist film is improved. When a fine resist pattern is formed in the photoresist film, the resist pattern is maintained stable without suffering degradation, collapse or stripping. When any underlying film is etched through the resist pattern, a pattern of satisfactory shape and dimensional accuracy is formed. As a result, a photomask having a mask pattern having a fine size at high accuracy is obtained.

EMBODIMENT FOR CARRYING OUT THE INVENTION

Now the invention is described in detail.

Figure 1A:
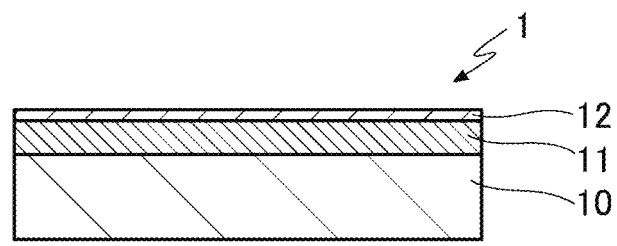
FIG. 1 is a set of cross-sectional views of a photomask blank in a first embodiment of the invention, and photomasks prepared from photomask blanks in first and second embodiments.

A first embodiment of the invention is a photomask blank comprising a transparent substrate, a first film disposed on the substrate, and a second film disposed contiguous to the first film. Specifically, a photomask blank as shown in FIG. 1(A) is exemplary. FIG. 1(A) is a cross-sectional view of one exemplary photomask blank in the first embodiment of the invention. The photomask blank 1 is illustrated as comprising a transparent substrate 10, a first film 11 disposed contiguous to the substrate 10, and a second film 12 disposed contiguous to the first film 11.

Figure 1B:
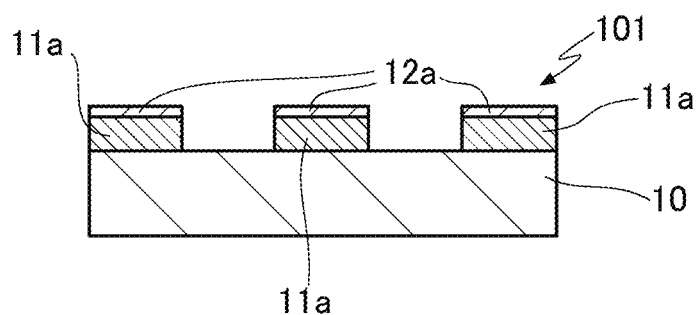
Figure 1C:
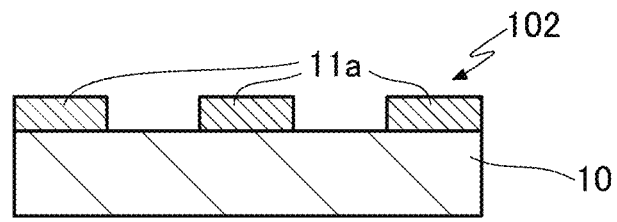

Also, cross-sectional views of exemplary photomasks prepared from the photomask blank shown in FIG. 1(A) are shown in FIGS. 1(B) and 1(C). FIG. 1(B) illustrates a case wherein the second film is a film functioning as a portion of optical film. The photomask 101 includes a mask pattern 11a of the first film formed on the transparent substrate 10, and a mask pattern 12a of the second film formed on the mask pattern 11a of first film. On the other hand, FIG. 1(C) illustrates a case wherein the second film is a processing aid film. The photomask 102 includes a mask pattern 11a of the first film formed on the transparent substrate 10.

Although FIG. 1(A) shows the embodiment wherein the first film 11 is disposed contiguous to the transparent substrate 10, another film may be formed between the transparent substrate and the first film, for example, an optical film such as a phase shift film, typically halftone phase shift film, light-shielding film or antireflective film, or a processing aid film such as etching mask film (hard mask film) or etching stop film. Included are an embodiment wherein a phase shift film is formed between the transparent substrate and the first film, an embodiment wherein a phase shift film and light-shielding film are formed in order from the transparent substrate side, and an embodiment wherein a phase shift film, etching stop film and light-shielding film are formed in order from the transparent substrate side.

Figure 2A:
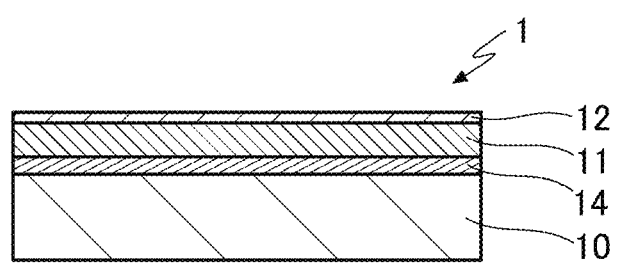
FIG. 2 is a set of cross-sectional views of other exemplary photomask blanks in the first embodiment of the invention.
Figure 2B:
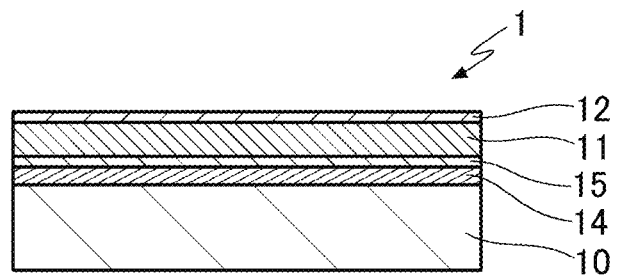

Exemplary of these embodiments are photomask blanks as shown in FIGS. 2(A) and 2(B). FIGS. 2(A) and 2(B) are cross-sectional views of different exemplary photomask blanks in the first embodiment of the invention. FIG. 2(A) illustrates a photomask blank 1 comprising a transparent substrate 10, a phase shift film 14 disposed contiguous to the substrate 10, a first film 11 disposed contiguous to the phase shift film 14, and a second film 12 disposed contiguous to the first film 11. FIG. 2(B) illustrates a photomask blank 1 comprising a transparent substrate 10, a phase shift film 14 disposed contiguous to the substrate 10, a light-shielding film 15 disposed contiguous to the phase shift film 14, a first film 11 disposed contiguous to the light-shielding film 15, and a second film 12 disposed contiguous to the first film 11.

Figure 3A:
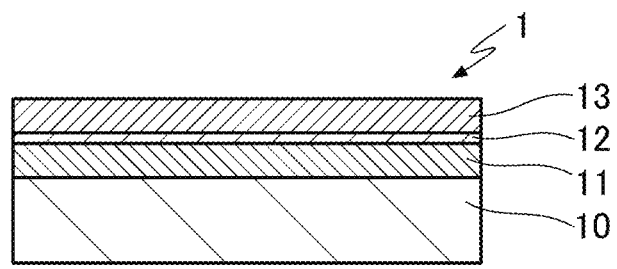
FIG. 3 is a set of cross-sectional views of exemplary photomask blanks in a second embodiment of the invention.

The photomask blank of the invention may further include a photoresist film disposed contiguous to the second film. This is the photomask blank of a second embodiment. Exemplary of the second embodiment is a photomask blank as shown in FIG. 3(A). FIG. 3(A) is a cross-sectional view of one exemplary photomask blank in the second embodiment. The photomask blank 1 includes a transparent substrate 10, a first film 11 disposed contiguous to the substrate 10, a second film 12 disposed contiguous to the first film 11, and a photoresist film 13 disposed contiguous to the second film 12. Photomasks produced from the photomask blank of FIG. 3(A) are similar to those shown in FIGS. 1(B) and 1(C).

Although FIG. 3(A) shows the embodiment wherein the first film 11 is disposed contiguous to the transparent substrate 10, the photomask blank of the second embodiment may also include another film between the transparent substrate and the first film as in the photomask blank of the first embodiment. Specifically, any films illustrated as other films in the photomask blank of the first embodiment may be formed in order between the transparent substrate and the first film.

Figure 3B:
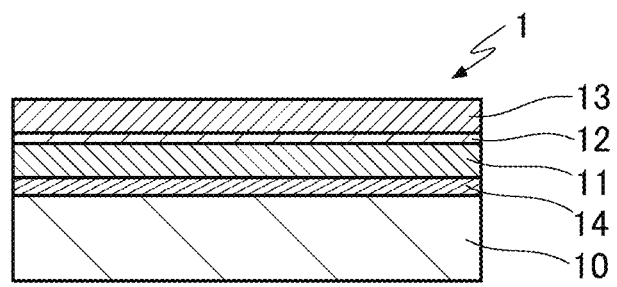
Figure 3C:
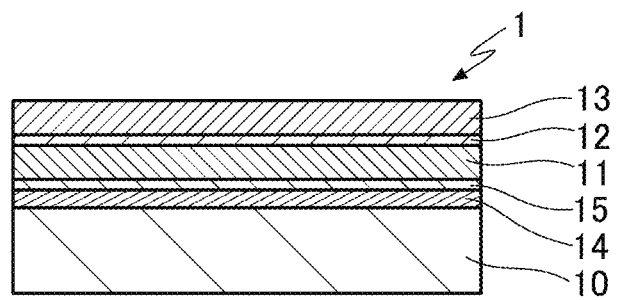

Exemplary of these embodiments are photomask blanks as shown in FIGS. 3(B) and 3(C). FIGS. 3(B) and 3(C) are cross-sectional views of different exemplary photomask blanks in the second embodiment of the invention. FIG. 3(B) illustrates a photomask blank 1 comprising a transparent substrate 10, a phase shift film 14 disposed contiguous to the substrate 10, a first film 11 disposed contiguous to the phase shift film 14, a second film 12 disposed contiguous to the first film 11, and a photoresist film 13 formed contiguous to the second film 12. FIG. 3(C) illustrates a photomask blank 1 comprising a transparent substrate 10, a phase shift film 14 disposed contiguous to the substrate 10, a light-shielding film 15 disposed contiguous to the phase shift film 14, a first film 11 disposed contiguous to the light-shielding film 15, a second film 12 disposed contiguous to the first film 11, and a photoresist film 13 disposed contiguous to the second film 12.

In the second embodiment, a surface treating agent or the like may be applied between the second film and the photoresist film, but another film corresponding to the optical film or processing aid film used in the photomask blank is not included therebetween.

In either of the first and second embodiments, another film corresponding to the optical film or processing aid film used in the photomask blank is not included between the first and second films.

While the transparent substrate used herein is a substrate for use in photomask blanks, it may be a substrate made of a material which is transparent to exposure light in photolithography using the photomask. The transparent substrate is not particularly limited as long as it experiences minimal deformation at the treatment temperature in the process for producing a photomask from the photomask blank. Quartz substrates are adequate as the transparent substrate.

The first film used herein is provided as an optical film such as a light-shielding film or an antireflective film included in photomask blanks, or a processing aid film such as an etching mask film (hard mask film) for processing a film formed below the first film (transparent substrate side) or the transparent substrate, or an etching stop film for processing a film formed on the first film (side remote from transparent substrate). The optical film as the first film may also be a film functioning as an etching mask film (hard mask film) for a film formed below that film or the transparent substrate, or an etching stop film for a film formed on that film. Namely, the mask pattern of the first film may be either a photomask pattern or an etching mask pattern.

The first film is composed of a material which is etchable by chlorine/oxygen-based dry etching with a gas mixture of chlorine gas ($Cl_2$) and oxygen gas ($O_2$), but resistant against fluorine-based dry etching with a fluorine-containing gas (such as $CF_4$, $SF_6$). As the first film used herein, for example, a chromium-containing material is preferred. The chromium-containing material can be a material which is etchable by chlorine/oxygen-based dry etching, but resistant against fluorine-based dry etching. Examples of the chromium-containing material include chromium alone, and chromium compounds containing chromium and at least one light element selected from oxygen, nitrogen and carbon, for example, chromium oxide (CrO), chromium nitride (CrN), chromium carbide (CrC), chromium oxynitride (CrON), chromium oxycarbide (CrOC), chromium nitride carbide (CrNC), and chromium oxide nitride carbide (CrONC). The chromium compound should preferably contain at least 10 at %, especially at least 30 at % of chromium and also preferably up to 95 at %, especially up to 70 at % of chromium. With respect to the contents of light elements, preferably the oxygen content is up to 60 at %, the nitrogen content is up to 60 at %, especially up to 30 at %, and the carbon content is up to 40 at %, especially up to 20 at %. With respect to the composition (content and atomic ratio) of the first film, second film and other films included in the invention, values measured by x-ray photoelectron spectroscopy (XPS or ESCA) are applicable.

The first film may be composed of a single layer or two or more layers. Where the first film is composed of two or more layers, the layers may be films of different function, for example, a light-shielding film and antireflective film. For example, the first film is preferably composed of two, three or more layers including a layer serving as light-shielding film and a layer serving as an antireflective film disposed on the side of the previous layer remote from the substrate, or two, three or more layers including a layer serving as light-shielding film and a layer disposed on the side of the previous layer close to the substrate and having a higher content of oxygen and/or nitrogen than the light-shielding film. Furthermore, the first film may be composed of three, four or more layers including a layer serving as light-shielding film, a layer disposed on the side of the light-shielding function layer remote from the substrate and serving as antireflective film, and a layer disposed on the side of the light-shielding function layer close to the substrate and having a higher content of oxygen and/or nitrogen than the light-shielding film.

The thickness of the first film is preferably at least 1 nm, more preferably at least 10 nm, even more preferably at least 30 nm, most preferably at least 40 nm, and up to 100 nm, more preferably up to 65 nm, although the thickness varies with the type.

When the first film is composed of a chromium-containing material, it is preferably deposited by a sputtering technique using at least one target containing chromium, because easy and well-controlled deposition is possible. The sputter deposition technique may be either DC sputtering or RF sputtering, with no limits imposed. Specifically, the film may be formed by a sputtering technique using a chromium target and an inert gas such as argon gas as the sputter gas or a reactive sputtering technique using an inert gas such as argon gas in combination with a reactive gas selected from oxygen gas ($O_2$ gas), nitrogen gas ($N_2$ gas), nitrogen oxide gas ($NO_2$ gas, NO gas, $N_2O$ gas), hydrocarbon gas ($CH_4$ gas), carbon oxide gas (CO gas, $CO_2$ gas) and the like.

Where another film(s) is formed between the transparent substrate and the first film, for example, where a phase shift film, typically halftone phase shift film, light-shielding film, antireflective film or the like is formed between the transparent substrate and the first film, the other film, especially at least the other film in contact with the first film is preferably one having different etching properties from the first film. Since the first film is composed of a material which is etchable by chlorine/oxygen-based dry etching with a gas mixture of chlorine gas ($Cl_2$) and oxygen gas ($O_2$), but resistant against fluorine-based dry etching with a fluorine-containing gas (e.g., $CF_4$, $SF_6$), the phase shift film, light-shielding film or antireflective film formed between the transparent substrate and the first film should preferably be composed of a material which is resistant against chlorine/oxygen-based dry etching with a gas mixture of chlorine gas ($Cl_2$) and oxygen gas ($O_2$), but etchable by fluorine-based dry etching with a fluorine-containing gas (e.g., $CF_4$, $SF_6$). Particularly when the other film is a halftone phase shift film, for example, a film having a phase shift of 160 to 190°, preferably approximately 180° and a transmittance of 3 to 40% is used.

The material for the film interposed between the transparent substrate and the first film and having different etching properties from the first film is preferably a silicon-containing material. Suitable silicon-containing materials include materials containing silicon and at least one light element selected from oxygen, nitrogen, carbon and hydrogen, and materials containing silicon, at least one light element selected from oxygen, nitrogen, carbon and hydrogen, and a transition metal. Examples of the silicon-containing material include silicon compounds such as silicon oxide (SiO), silicon nitride (SiN), silicon oxynitride (SiON), silicon oxycarbide (SiOC), silicon nitride carbide (SiNC), and silicon oxide nitride carbide (SiONC), and transition metal silicon compounds such as transition metal silicon oxide (MeSiO), transition metal silicon nitride (MeSiN), transition metal silicon oxynitride (MeSiON), transition metal silicon oxycarbide (MeSiOC), transition metal silicon nitride carbide (MeSiNC), and transition metal silicon oxide nitride carbide (MeSiONC). Examples of the transition metal (Me) include molybdenum, tantalum, zirconium, tungsten, titanium and hafnium. Of these, molybdenum, tantalum, zirconium, and tungsten are preferred, with molybdenum being most preferred. The preferred silicon-containing material is free of chromium.

The technique for forming the other film is preferably a sputtering technique using at least one silicon-containing target such as silicon target (Si target) or transition metal-silicon target (MeSi target), and optionally, a transition metal target (Me target). The sputter deposition technique may be either DC sputtering or RF sputtering, with no limits imposed. Specifically, the film may be formed by a reactive sputtering technique using an inert gas such as argon gas in combination with a reactive gas selected from oxygen gas ($O_2$ gas), nitrogen gas ($N_2$ gas), nitrogen oxide gas ($NO_2$ gas, NO gas, $N_2O$ gas), carbon oxide gas (CO gas, $CO_2$ gas), hydrocarbon gas ($CH_4$ gas) and the like.

The second film used herein is a film functioning as a hard mask during etching of the first film and composed of a material which is not substantially etched during the chlorine/oxygen-based dry etching of the first film with a gas mixture of chlorine gas ($Cl_2$) and oxygen gas ($O_2$), differently stated, a material which is resistant against chlorine/oxygen-based dry etching. Also, the second film is preferably composed of a material which is etchable by fluorine-based dry etching with a fluorine-containing gas (e.g., $CF_4$, $SF_6$). The second film may be either a processing aid film which is stripped after formation of a mask pattern of the first film, or a film which is left after formation of a mask pattern of the first film, as a portion of the mask pattern of photomask and functions as a portion of optical film (e.g., light-shielding film, antireflective film or phase shift film). Namely, the mask pattern of the second film may be either an etching mask pattern or a photomask pattern.

The second film used herein is composed of a silicon-containing material consisting of silicon and oxygen or silicon, oxygen, and nitrogen, that is, a material which is resistant against chlorine/oxygen-based dry etching, but etchable by fluorine-based dry etching. In the invention, the second film should be composed of a material having a Si—Si bond. The material in the form of a silicon compound consisting of silicon and oxygen or silicon, oxygen, and nitrogen, having a Si—Si bond is a silicon compound wherein oxygen or oxygen and nitrogen are unsaturated in stoichiometry relative to silicon. That is, when the second film consists of silicon and oxygen, the atomic ratio of silicon and oxygen is O/Si<2. The atomic ratio O/Si is preferably up to 1.9, more preferably up to 1.5, even more preferably up to 1.3, and at least 0.1, more preferably at least 0.3. In another example where the second film consists of silicon, oxygen and nitrogen, the atomic ratio of silicon, oxygen and nitrogen is (2O+3N)/Si<4. The atomic ratio (2O+3N)/Si is preferably up to 3.9, more preferably up to 3.0, even more preferably up to 2.6, and at least 0.1, more preferably at least 0.5.

When a photoresist film to be described later is coated contiguous to the second film composed of the above-defined material, a strong bond or adhesion is established between the second film and the photoresist film. Thereafter, a resist pattern is formed from the photoresist film coated on the second film. Even when a fine resist pattern is formed from the photoresist film, the resist pattern is maintained stable without suffering degradation, collapse or stripping, and a fine mask pattern of satisfactory shape and dimensional accuracy can be formed during subsequent etching of the second film and first film using the resist pattern. On the contrary, a Si—Si bond-free silicon compound such as $SiO_2$ is undesirable because a fine resist pattern cannot be formed in a stable manner, as compared with the use of a film of Si—Si bond-bearing silicon compound, and a mask pattern affording a sufficient resolution in the photolithography using the photomask is not obtainable.

The second film preferably has a silicon content of at least 34 at %, more preferably at least 40 at %, and up to 95 at %, more preferably up to 80 at %. The oxygen content is preferably at least 1 at %, more preferably at least 10 at %, and up to 66 at %, more preferably up to 60 at %. Where the second film contains nitrogen, the nitrogen content is preferably up to 40 at %, more preferably up to 20 at %. The second film may be composed of a single layer or two or more layers. Where the second film is composed of two or more layers, each layer preferably has contents of silicon, oxygen and nitrogen in the above-defined ranges.

The second film is preferably thin because a thin second film allows the photoresist film to be reduced in thickness, but too thin a film does not fully function as the second film. The thickness of the second film is preferably at least 2 nm, more preferably at least 5 nm and up to 20 nm, more preferably up to 10 nm, although the thickness varies with the type of the first film to be etched when the second film is used as hard mask.

Also preferably, the second film has a sheet resistivity of up to $1\times10^{11}$ ohm/squares ($\Omega/\square$). A sheet resistivity of up to $1\times10^{11}\Omega/\square$ is preferable because writing of a photoresist pattern is possible under the suppressed influence of a charge buildup during EB writing of a photoresist film.

The process for forming the second film composed of an unsaturated silicon compound may be deposition by CVD using a silicon-containing gas such as monosilane, dichlorosilane or trichlorosilane, although sputter deposition using at least one silicon-containing target is preferable because easy and well-controlled deposition is possible. The sputter deposition technique may be either DC sputtering or RF sputtering, with no limits imposed. Specifically, the film may be formed by a reactive sputtering technique using a silicon target and an inert gas such as argon gas in combination with a reactive gas selected from oxygen gas ($O_2$ gas), nitrogen gas ($N_2$ gas), nitrogen oxide gas ($NO_2$ gas, NO gas, $N_2O$ gas), and the like as the sputter gas.

The resist material for the photoresist film used herein is not particularly limited, but preferably a chemically amplified resist material, with more effects available from a negative tone chemically amplified resist material. Of the chemically amplified resist materials, especially negative tone chemically amplified resist materials, those adapted for EB image writing are preferably used. A resist material comprising hydroxystyrene or (meth)acrylate resin and an acid generator is preferable. The resist material may further contain a crosslinker whereas it may further contain at least one component selected from a quencher and a surfactant. The photoresist film preferably has a thickness of up to 150 nm, more preferably up to 100 nm. The lower limit of the thickness of the photoresist film is typically at least 50 nm though not critical. In forming the photoresist film, any prior art well-known methods may be applicable.

When the combination of the photoresist film and the second film, that is, the deposition of a photoresist film of chemically amplified resist material contiguous to the second film composed of a material consisting of silicon and oxygen, or silicon, oxygen and nitrogen and having a Si—Si bond is involved in the photomask blank or in the process for producing a photomask, there is obtained the advantage of improved adhesion. Further when the photoresist film has a thickness of up to 150 nm, especially up to 100 nm, in conjunction with a transmissive photomask for use in photolithography for forming a fine pattern with a width of up to 30 nm, preferably up to 20 nm, more preferably up to 10 nm, using exposure light of wavelength up to 200 nm, a mask pattern of the first film can be formed to an excellent shape and dimensional accuracy.

Now referring to FIGS. 4 and 5, the method for preparing a photomask blank in the first or second embodiment, the method for producing a photomask from the photomask blank, and the method for forming a mask pattern of the first film are described.

FIG. 4 is a set of cross-sectional views, schematically illustrating exemplary steps for preparing the photomask blank. First, as shown in FIG. 4(A), a transparent substrate 10 is furnished. As shown in FIG. 4(B), a first film 11 is formed on the substrate 10 (first film forming step). Then a second film 12 is formed on the first film 11 (second film forming step), completing a photomask blank 1 in the first embodiment as shown in FIG. 1(A) or FIG. 4(C). Once the second film 12 is formed on the first film 11, a photoresist film 13 is formed on the second film 12 (photoresist film forming step), completing a photomask blank 1 in the second embodiment as shown in FIG. 3(A) or FIG. 4(D).

Figure 4A:
FIG. 4 schematically illustrates exemplary steps for preparing the photomask blank in the first or second embodiment of the invention.
Figure 4B:
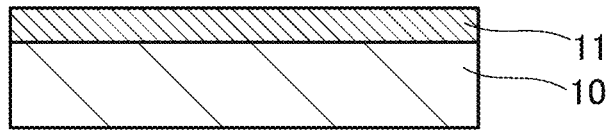
Figure 4C:
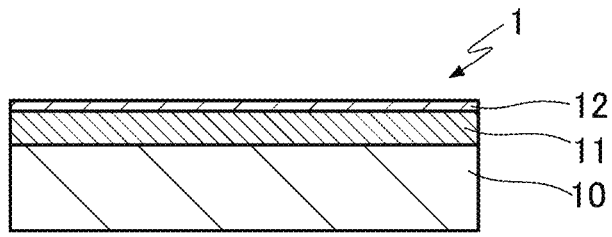
Figure 4D:
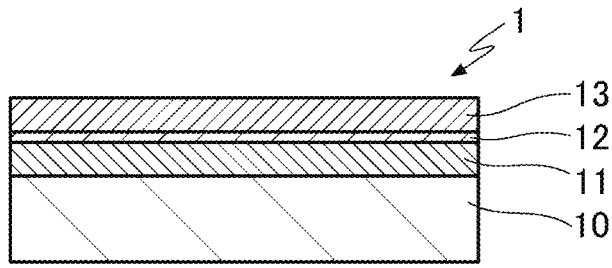

FIG. 5 is a set of cross-sectional views, schematically illustrating exemplary steps for producing a photomask from the photomask blank in the first embodiment shown in FIG. 4(C) or the photomask blank in the second embodiment shown in FIG. 4(D). In the case of the photomask blank in the first embodiment shown in FIG. 4(C), first a photoresist film 13 is formed on the second film 12 (photoresist film forming step). Next, in either embodiment, the photoresist film 13 is patterned as shown in FIG. 5(A), via patternwise writing by a well-known method, for example, EB writing and developing the resist after patternwise writing, thereby forming a resist pattern 13a (resist pattern forming step). Next, as shown in FIG. 5(B), with the resist pattern 13a made etching mask, the second film 12 is patterned by fluorine-based dry etching, whereby a mask pattern 12a of the second film is formed (second film mask pattern forming step), and the resist pattern 13a is stripped as shown in FIG. 5(C). Although the above description refers to an example wherein the resist pattern 13a is stripped after etching of the second film 12, it is acceptable that the resist pattern 13a is left (not stripped) in this step, and stripped after etching of the first film 11 as will be described later.

Figure 5A:
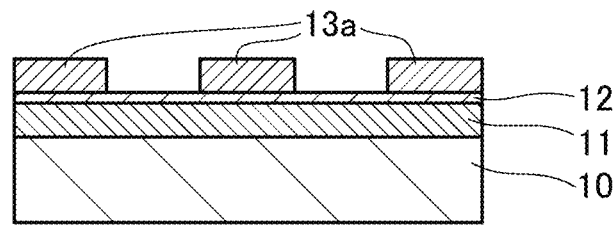
FIG. 5 schematically illustrates exemplary steps for producing a photomask from the photomask blank in the first or second embodiment of the invention.
Figure 5B:
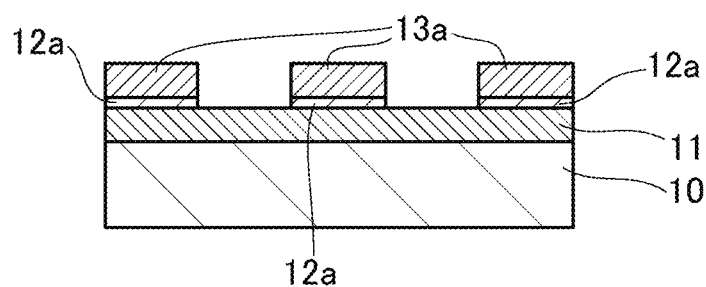
Figure 5C:
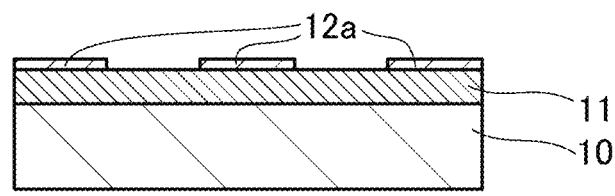
Figure 5D:
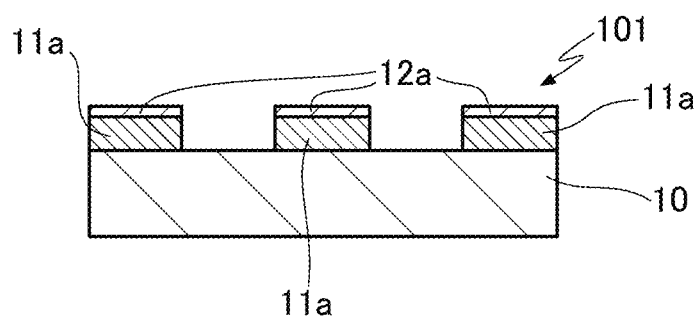
Figure 5E:
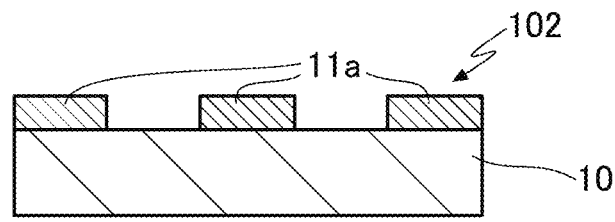

Next, with the mask pattern 12a of the second film made etching mask, the first film 11 is patterned by chlorine/oxygen-based dry etching, whereby a mask pattern 11a of the first film is formed (first film mask pattern forming step), and when the resist pattern 13a is left, the resist pattern 13a is stripped at this stage, completing a photomask 101 wherein the second film is a film functioning as a portion of optical film as shown in FIG. 1(B) or FIG. 5(D). Also where the second film is a film functioning as a portion of optical film, another resist pattern is formed if necessary, and a part of the mask pattern 11a of the second film may then be stripped. On the other hand, where the second film is a processing aid film, another resist pattern is formed if necessary, and the entirety of the mask pattern 12a of the second film is then stripped, completing a photomask 102 as shown in FIG. 1(C) or FIG. 5(E).

From the foregoing steps, a transmissive photomask comprising a transparent substrate, and a photomask pattern of first film, or a photomask pattern of first film and a photomask pattern of second film may be produced as the photomask of the first or second embodiment. A mask pattern of first film can be formed from the first film deposited on the transparent substrate in the photomask blank.

Next referring to FIGS. 6 and 7, the method for preparing a photomask blank having a phase shift film, typically halftone phase shift film between the transparent substrate and the first film in the first or second embodiment, i.e., a phase shift mask blank, typically a halftone phase shift mask blank, the method for producing a photomask from the photomask blank, and the method for forming a mask pattern of the first film are described.

FIG. 6 is a set of cross-sectional views, schematically illustrating exemplary steps for preparing the other photomask blank. First, as shown in FIG. 6(A), a transparent substrate 10 is furnished. As shown in FIG. 6(B), a phase shift film 14 is formed on the substrate 10 (phase shift film forming step). Then as shown in FIG. 6(C), a first film 11 is formed on the phase shift film 14 (first film forming step).

Figure 6A:
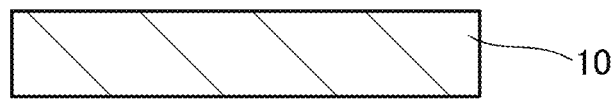
FIG. 6 is a set of schematic views illustrating another exemplary process for preparing the photomask blank in the first or second embodiment of the invention.
Figure 6B:
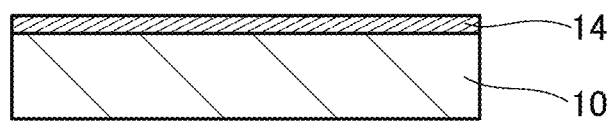
Figure 6C:
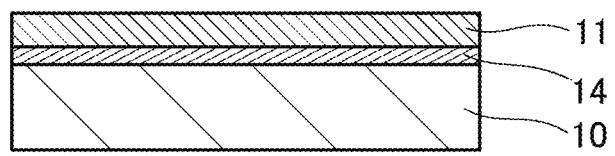
Figure 6D:
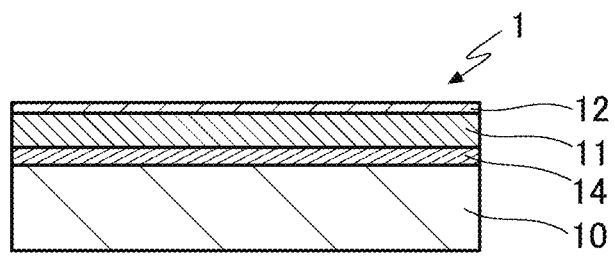

Next a second film 12 is formed on the first film 11 (second film forming step), completing a photomask blank 1 in the first embodiment as shown in FIG. 2(A) or FIG. 6(D). Once the second film 12 is formed on the first film 11, a photoresist film 13 is formed on the second film 12 (photoresist film forming step), completing a photomask blank 1 as shown in FIG. 3(B) or FIG. 6(E).

Figure 6E:
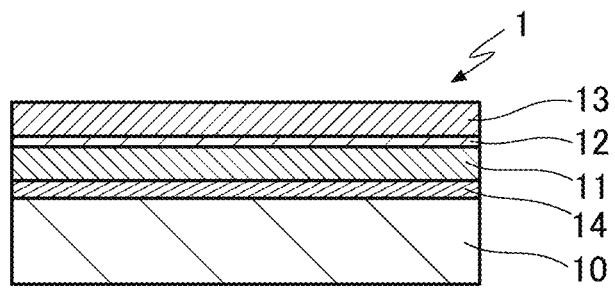

FIG. 7 is a set of cross-sectional views, schematically illustrating exemplary steps for producing a photomask from the photomask blank in the first embodiment shown in FIG. 6(D) or the photomask blank in the second embodiment shown in FIG. 6(E). In the case of the photomask blank in the first embodiment shown in FIG. 6(D), first a photoresist film is formed on the second film 12 (photoresist film forming step). Next, in either embodiment, the photoresist film 13 is patterned as shown in FIG. 7(A), via patternwise writing by a well-known method, for example, EB writing and developing the resist after patternwise writing, thereby forming a resist pattern 13a (resist pattern forming step). Next, as shown in FIG. 7(B), with the resist pattern 13a made etching mask, the second film 12 is patterned by fluorine-based dry etching, whereby a mask pattern 12a of the second film is formed (second film mask pattern forming step), and the resist pattern 13a is stripped as shown in FIG. 7(C). Although the above description refers to an example wherein the resist pattern 13a is stripped after etching of the second film 12, it is acceptable that the resist pattern 13a is left (not stripped) in this step, and stripped after etching of the first film 11 as will be described later.

Figure 7A:
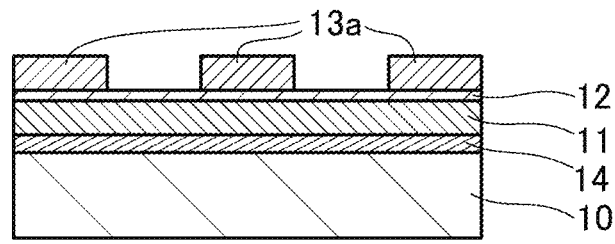
FIG. 7 is a set of schematic views illustrating another exemplary process for producing a photomask from the photomask blank in the first or second embodiment of the invention.
Figure 7B:
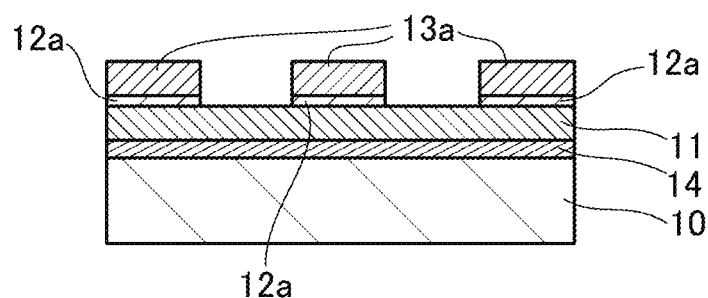
Figure 7C:
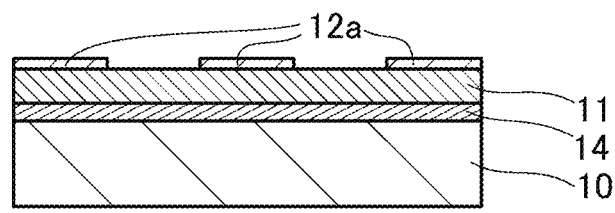
Figure 7D:
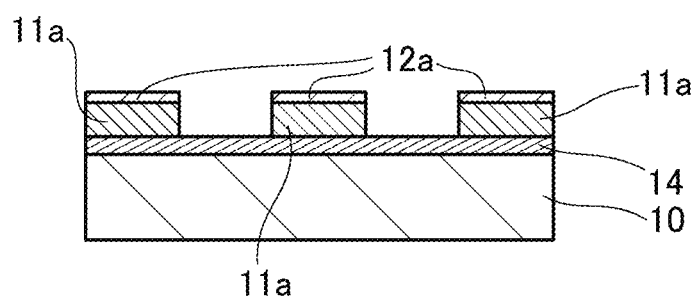
Figure 7E:
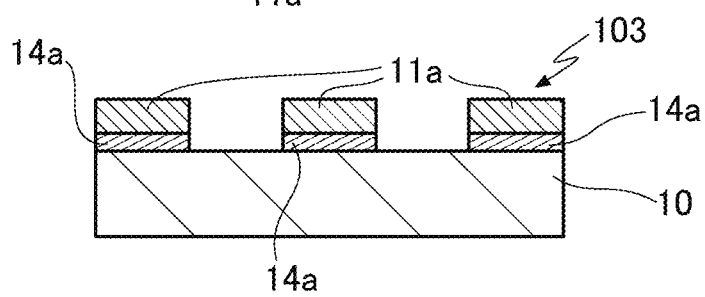
Figure 7F:
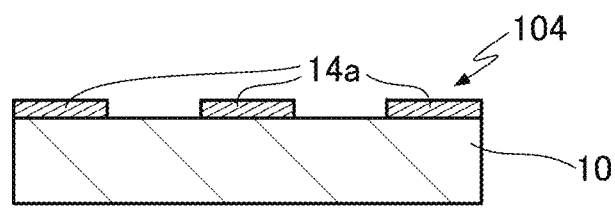

Next, as shown in FIG. 7(D), with the mask pattern 12a of the second film made etching mask, the first film 11 is patterned by chlorine/oxygen-based dry etching, whereby a mask pattern 11a of the first film is formed (first film mask pattern forming step), and when the resist pattern 13a is left, the resist pattern 13a is stripped at this stage. Next, with the mask pattern 11a of the first film made etching mask, the phase shift film 14 is patterned by fluorine-based dry etching, whereby a mask pattern 14a of phase shift film is formed, and the mask pattern 12a of the second film is stripped, completing a photomask 103 wherein the first film is a film functioning as a portion of optical film as shown in FIG. 7(E). Also where the first film is a film functioning as a portion of optical film, another resist pattern is formed if necessary, and a part of the mask pattern 11a of the first film may then be stripped. On the other hand, where the first film is a processing aid film, another resist pattern is formed if necessary, and the entirety of the mask pattern 11a of the first film is then stripped, completing a photomask 104 as shown in FIG. 7(F).

From the foregoing steps, a transmissive photomask comprising a transparent substrate, and a mask pattern of phase shift film, typically halftone phase shift film or a mask pattern of phase shift film, typically halftone phase shift film and a photomask pattern of the first film, that is, a phase shift mask such as halftone phase shift mask may be produced as the photomask of the first or second embodiment. A mask pattern of first film can be formed from the first film deposited on the transparent substrate in the photomask blank.

The photomask blank of the invention is advantageous as a photomask blank for forming a photomask pattern with a width of up to 45 nm on a photomask using exposure light of wavelength up to 200 nm; and also advantageous as a photomask blank intended to prepare a transmissive photomask for use in photolithography for forming a fine pattern with a width of up to 40 nm, preferably up to 30 nm, more preferably up to 20 nm, and even more preferably up to 10 nm on a substance to be transferred.

EXAMPLES

Examples and Comparative Examples are given below by way of illustration and not by way of limitation.

Example 1

A phase shift film of MoSiON (75 nm thick) was deposited on a quartz substrate of 152 mm squares and ~6 mm thick by sputtering. Deposition was carried out by using oxygen gas, nitrogen gas and argon gas as the sputtering gas, using two targets: $MoSi_2$ target and Si target, and spinning the substrate at 30 rpm. The composition of the phase shift film was analyzed by ESCA using X-ray photoelectron spectrometer (K-Alpha by Thermo Fisher Scientific), finding Mo:Si:O:N=1:4:1:4 (atomic ratio).

Next, on the phase shift film, a light-shielding film consisting of two layers, a layer of CrN (30 nm thick) and a layer of CrON (20 nm thick) in order from the quartz substrate side was deposited as the first film by sputtering. Deposition was carried out by using nitrogen gas and argon gas for the CrN layer and oxygen gas, nitrogen gas and argon gas for the CrON layer as the sputtering gas, using metallic chromium as the target, and spinning the substrate at 30 rpm. The composition of the light-shielding film was analyzed by ESCA, finding Cr:N=9:1 (atomic ratio) for the CrN layer and Cr:O:N=4:5:1 (atomic ratio) for the CrON layer.

Figures 8, 9:
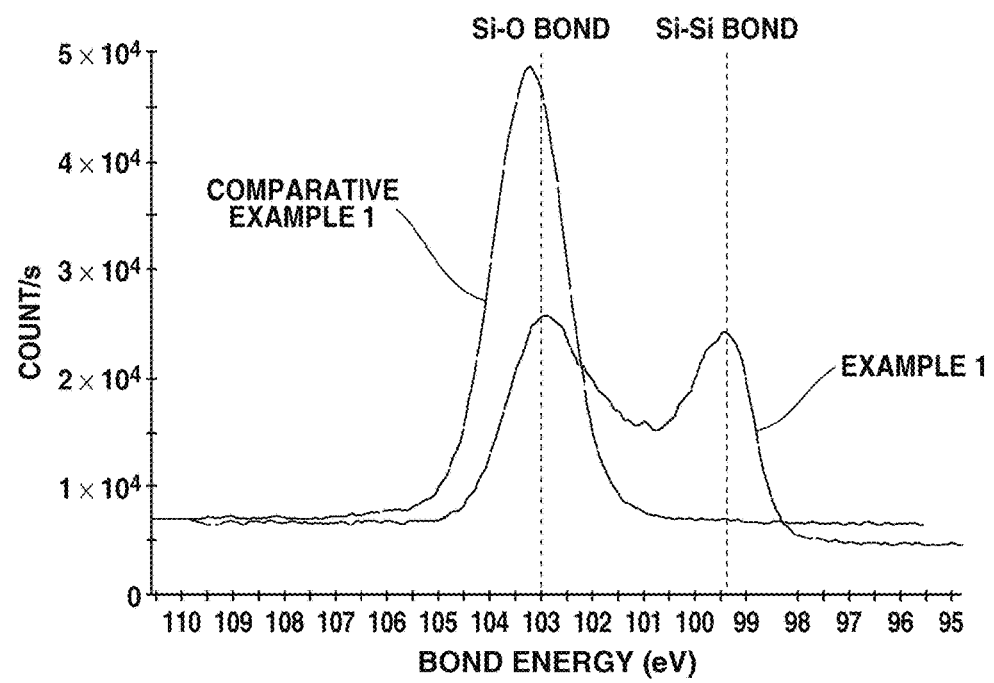
FIG. 8 is a diagram showing XPS profiles of etching mask films in Example 1 and Comparative Example 1.
FIG. 9 is a set of scanning electron microscope (SEM) images of resist patterns printed in Example 1 and Comparative Example 1.

Next, on the light-shielding film, an etching mask film (hard mask film) in the form of a single layer of SiO (5 nm thick) was deposited as the second film by sputtering. Deposition was carried out by using oxygen gas and argon gas as the sputtering gas, using Si as the target, and spinning the substrate at 30 rpm. The composition of the etching mask film was analyzed by ESCA, finding Si:O=1:1 (atomic ratio). The XPS profile by ESCA is shown in FIG. 8. From the XPS profile, a Si—Si bond at an intensity (area intensity) corresponding to the bond energy of Si—O bond was confirmed.

Further, the etching mask film was treated at its surface with hexamethyldisilazane (HMDS). Thereafter, a negative tone chemically amplified EB resist (SEBN-1637 by Shin-Etsu Chemical Co., Ltd.) was coated to form a photoresist film (100 nm thick), obtaining a photomask blank.

Next, the photoresist film on the photomask blank was imaged in a pattern including varying line widths on an EB lithography system, developed in tetramethylammonium hydroxide, and rinsed with deionized water, yielding a resist pattern. The resist pattern was observed under scanning electron microscope (SEM), with the result shown in FIG. 9. It is evident that a satisfactory resist pattern was formed as long as the line width was equal to or greater than 40 nm.

Comparative Example 1

A phase shift film and a light-shielding film as in Example 1 were deposited on a quartz substrate of 152 mm squares and ~6 mm thick. Next, on the light-shielding film, an etching mask film (hard mask film) in the form of a single layer of $SiO_2$ (5 nm thick) was deposited by sputtering. Deposition was carried out by using oxygen gas and argon gas as the sputtering gas, using Si as the target, and spinning the substrate at 30 rpm. The composition of the etching mask film was analyzed by ESCA, finding Si:O=1:2 (atomic ratio). The XPS profile by ESCA is also shown in FIG. 8.

From the XPS profile, the bond energy of Si—Si bond was not observed, confirming the absence of Si—Si bond. Further a photoresist film was formed as in Example 1, obtaining a photomask blank.

Next, as in Example 1, a resist pattern was defined in a photoresist film on the photomask blank. The resist pattern was observed under SEM, with the result shown in FIG. 9. It is evident that a satisfactory resist pattern was formed only when the line width was equal to or greater than 50 nm.

REFERENCE SIGNS LIST

1 photomask blank
10 transparent substrate
11 first film
11a mask pattern of first film
12 second film
12a mask pattern of second film
13 photoresist film
13a resist pattern
14 phase shift film
14a pattern of phase shift film
15 light-shielding film
101, 102, 103, 104 photomask

The invention claimed is:

1. A photomask blank which is processed into a transmissive photomask for use in photolithography for forming a pattern on a substance to be transferred using exposure light of wavelength up to 200 nm, the photomask blank comprising
   a transparent substrate,
   a first film disposed on the substrate and composed of a material which is etchable by chlorine/oxygen-based dry etching with a gas mixture of chlorine and oxygen gases and resistant against fluorine-based dry etching with a fluorine-containing gas,
   a second film disposed contiguous to the first film and composed of a material which consists of silicon and oxygen in an atomic ratio O/Si of from 0.1 to 1.9 or silicon, oxygen, and nitrogen in an atomic ratio (2O+3N)/Si of from 0.1 to 3.9, is not substantially etched during the chlorine/oxygen-based dry etching of the first film, and has a Si—Si bond, and
   a photoresist film disposed contiguous to the second film and having a thickness of up to 150 nm.

2. The photomask blank of claim 1 wherein the photoresist film is a chemically amplified resist film.

3. The photomask blank of claim 1 wherein the second film contains oxygen in an amount from 1 at % to 66 at %.

4. The photomask blank of claim 1 wherein the second film has a thickness from 2 nm to 20 nm.

5. The photomask blank of claim 1 wherein the second film has a sheet resistivity of up to $1\times10^{11}\Omega/\square$.

6. The photomask blank of claim 1, further comprising a phase shift film between the transparent substrate and the first film.

7. The photomask blank of claim 1 wherein said atomic ratio O/Si is from 0.3 to 1.3, and said atomic ratio (2O+3N)/Si is from 0.5 to 2.6.

8. The photomask blank of claim 1 wherein the second film contains silicon in an amount from 40 at % to 80 at %.

9. A method for preparing a photomask comprising the steps of:
   forming a first film on a transparent substrate, the first film being composed of a material which is etchable by chlorine/oxygen-based dry etching with a gas mixture of chlorine and oxygen gases and resistant against fluorine-based dry etching with a fluorine-containing gas, forming a second film contiguous to the first film, the second film being composed of a material which consists of silicon and oxygen in an atomic ratio O/Si of from 0.1 to 1.9 or silicon, oxygen, and nitrogen in an atomic ratio (2O+3N)/Si of from 0.1 to 3.9, has a Si—Si bond and is not substantially etched during the chlorine/oxygen-based dry etching of the first film, forming a chemically amplified resist film contiguous to the second film, the resist film having a thickness of up to 150 nm, patterning the chemically amplified resist film to form a resist pattern, patterning the second film by the fluorine-based dry etching with the resist pattern made etching mask, for thereby forming a mask pattern of the second film, and patterning the first film by the chlorine/oxygen-based dry etching with the mask pattern of the second film made etching mask, for thereby forming a mask pattern of the first film.

10. The method of claim 9, further comprising the steps of:

forming a phase shift film between the transparent substrate and the first film, and patterning the phase shift film by fluorine-based dry etching with the mask pattern of the first film made etching mask, for thereby forming a mask pattern of the phase shift film.

11. The method of claim 9 which is intended to prepare a transmissive photomask for use in photolithography for forming a fine pattern with a width of up to 30 nm on a substance to be transferred using exposure light of wavelength up to 200 nm.

12. The method of claim 9 wherein said atomic ratio O/Si is from 0.3 to 1.3, and said atomic ratio (2O+3N)/Si is from 0.5 to 2.6.

13. The method of claim/wherein the second film contains silicon in an amount from 40 at % to 80 at %.

14. A method for forming a mask pattern of a first film, the first film being disposed on a transparent substrate and composed of a material which is etchable by chlorine/oxygen-based dry etching with a gas mixture of chlorine and oxygen gases and resistant against fluorine-based dry etching with a fluorine-containing gas, the method comprising the steps of:

forming a second film contiguous to the first film, the second film being composed of a material which consists of silicon and oxygen in an atomic ratio O/Si of from 0.1 to 1.9 or silicon, oxygen, and nitrogen in an atomic ratio (2O+3N)/Si of from 0.1 to 3.9, has a Si—Si bond and is not substantially etched during the chlorine/oxygen-based dry etching of the first film, forming a chemically amplified resist film contiguous to the second film, the resist film having a thickness of up to 150 nm, patterning the chemically amplified resist film to form a resist pattern, patterning the second film by the fluorine-based dry etching with the resist pattern made etching mask, for thereby forming a mask pattern of the second film, and patterning the first film by the chlorine/oxygen-based dry etching with the mask pattern of the second film made etching mask, for thereby forming a mask pattern of the first film.

15. The method of claim 14 wherein said atomic ratio O/Si is from 0.3 to 1.3, and said atomic ratio (2O+3N)/Si is from 0.5 to 2.6.

16. The method of claim 14 wherein the second film contains silicon in an amount from 40 at % to 80 at %.

\* \* \* \* \*